United States Patent
Chen et al.

(10) Patent No.: US 7,302,304 B2
(45) Date of Patent: Nov. 27, 2007

(54) SYSTEMS AND METHODS FOR PRODUCTION PLANNING

(75) Inventors: Phillip Chen, Hsinchu (TW); Jung-Lung Tsai, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 2 days.

(21) Appl. No.: 11/245,533

(22) Filed: Oct. 7, 2005

(65) Prior Publication Data
US 2007/0083281 A1    Apr. 12, 2007

(51) Int. Cl.
*G06F 19/00* (2006.01)

(52) U.S. Cl. ............... 700/101; 700/95; 700/100; 700/121

(58) Field of Classification Search ............ 700/90, 700/95, 97, 99, 100–101, 121
See application file for complete search history.

(56) References Cited

U.S. PATENT DOCUMENTS

| | | | | |
|---|---|---|---|---|
| 5,751,580 A | * | 5/1998 | Chi | 700/101 |
| 6,317,725 B1 | * | 11/2001 | Muraoka | 705/28 |
| 6,434,440 B1 | * | 8/2002 | Teranishi et al. | 700/97 |
| 6,622,055 B2 | * | 9/2003 | Fan et al. | 700/99 |
| 6,862,484 B2 | * | 3/2005 | Hayashi | 700/73 |

* cited by examiner

*Primary Examiner*—Alexander Kosowski
(74) *Attorney, Agent, or Firm*—Thomas, Kayden, Horstmeyer & Risley

(57) ABSTRACT

A system for production planning. A MES provides production information corresponding to a preset time period of a production line, monitors processing of work-in-process (WIP), and provides processing status information of the WIP. A processor determines a move target for the WIP in the production line during the preset time period according to the production information, calculates achieved moves of the WIP, and compares the move target and the achieved moves.

17 Claims, 5 Drawing Sheets

SYSTEMS AND METHODS FOR PRODUCTION PLANNING

BACKGROUND

The invention relates generally to production planning, and more particularly to move target setting for a product flow in a manufacturing environment.

In processing lines for semiconductor fabrication, there are various processing stages through which wafer lots proceed to achieve a production goal specified in a master production schedule (MPS). The progress of wafer lots through a processing line is monitored for management purposes. A 'move' is a basic unit for calculating the progress of wafer fabrication. For example, when a wafer completes one processing stage, one 'move' is achieved. Typically, a monthly move target is set for a semiconductor fab, specifying a monthly goal of product moves.

Various conventional methods of move target setting have been developed to manage product flows. According to one conventional method, the move target is determined according to cycle time of product fabrication in a manufacturing system. This method uses the cycle time of the product fabrication and number of working days specified in current month MPS and next month MPS to determine a move target for products for a current month. When the cycle time exceeds the sum of working days of the current month, the MPSs of the next two months are considered in determining the move target of the current month. The conventional method focuses on the quantity of achieved moves, but ignores move targets assigned to products of different months.

According to another conventional method, achieved moves of products are calculated, and a move target thereof is determined accordingly. The achieved moves of a particular product are referred to as the "WIP energy" thereof, and may be used to estimate impact of the WIP profile on move target achievement.

Both methods focus on quantities of moves, and neglect the 'composition' thereof.

Ensuring quantities of moves achieve a preset target, however, cannot guarantee a corresponding delivery requirement being fulfilled. For example, a monthly move target is set as 900,000, and a daily move target is 30,000 accordingly. Monthly delivery requirement, however, may not be fulfilled when daily movement targets are achieved for each working day during the month. For example, there are two products A and B being fabricated, wherein product A is to be delivered this month, while product B is to be delivered next month. When the achieved moves are accomplished on WIPs of product B, and product A is suspended, the delivery requirement of product A may not be fulfilled although the daily move target is achieved. The "composition" of the moves is neglected conventionally, in spite of its importance.

SUMMARY

The present invention provides a system for production planning, comprising a manufacturing executive system (MES) and a processor. The MES provides production information corresponding to a preset time period of a production line, monitors processing of work-in-process (WIP), and provides processing status information of the WIP. The processor determines a move target for the WIP in the production line during the preset time period according to the production information, calculates achieved moves of the WIP, and compares the move target and the achieved moves.

In a provided method of production planning, the production information corresponds to a production line during a preset time period. A move target is determined according to the production information, wherein the move target specifies a number of required WIP moves in the production line during the preset time period. Processing of the WIP is monitored and the number of achieved moves thereof is calculated accordingly. The move target and the number of achieved moves are then compared to determine whether the progress of the WIP conforms to the preset move target.

The method may take the form of program code embodied in a tangible media. When the program code is loaded into and executed by a machine, the machine becomes an apparatus for practicing the method.

DESCRIPTION OF THE DRAWINGS

The invention can be more fully understood by reading the subsequent detailed description and examples with references made to the accompanying drawings, wherein.

DETAILED DESCRIPTION

Exemplary embodiments of the invention will now be described with reference to FIGS. 1 through 5, which generally relate to production planning in a manufacturing environment. While some embodiments of the invention are applied to semiconductor manufacturing, it is understood other manufacturing systems involving move target setting may be readily substituted.

In the following detailed description, reference is made to the accompanying drawings which form a part hereof, and in which is shown by way of illustration of specific embodiments. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense. The leading digit(s) of reference numbers appearing in the Figures corresponds to the Figure number, with the exception that the same reference number is used throughout to refer to an identical component which appears in multiple Figures.

Figure 1:
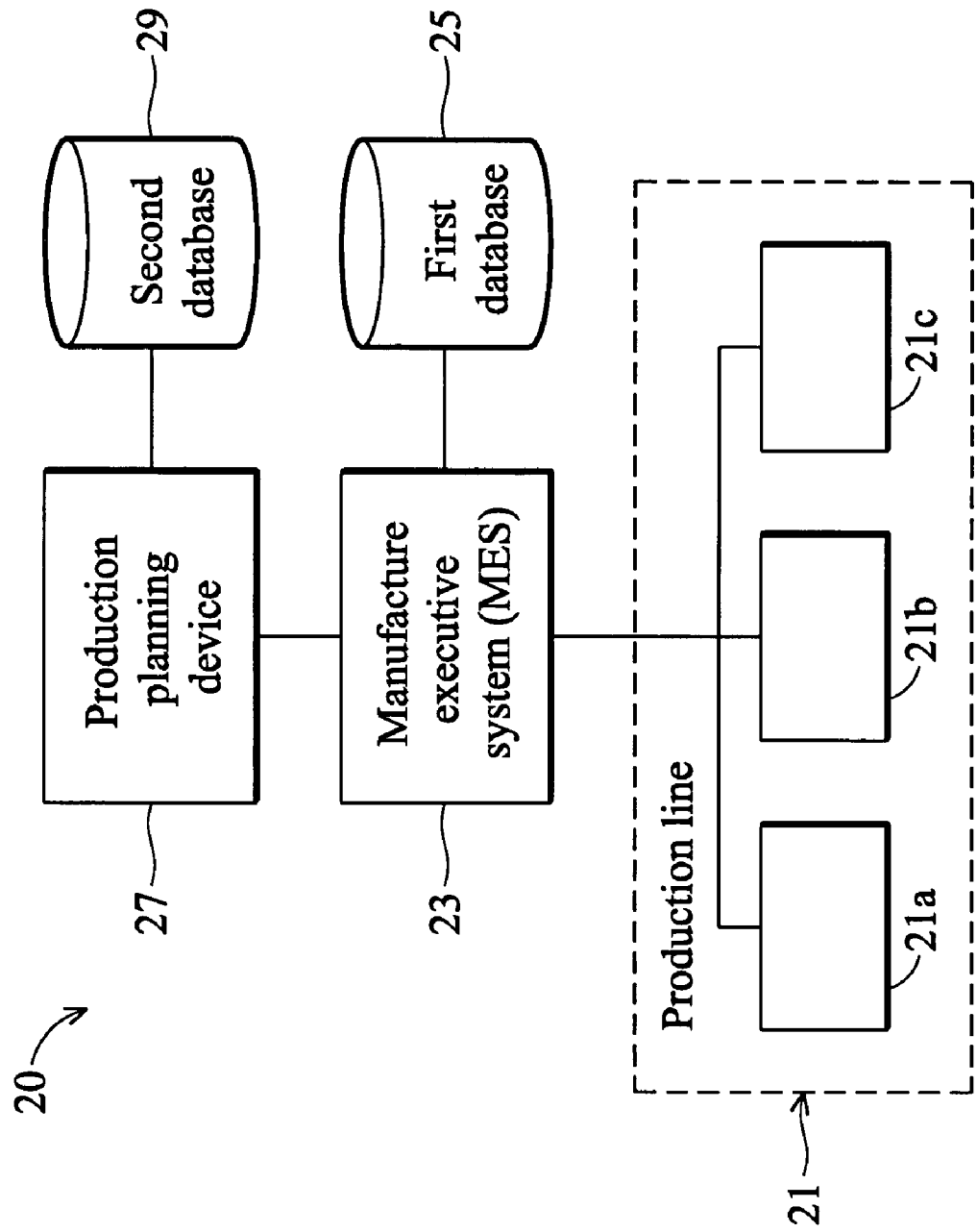
FIG. 1 is a schematic view of an embodiment of a manufacturing system implementing production planning.

FIG. 1 is a schematic view of an embodiment of a manufacturing system implementing production planning. Specifically, a manufacturing system 20 comprises production line 21, a manufacture executive system (MES) 23, a first database 25, a production planning device 27, and a second database 29. Production line 21 comprises processing station 21a~21c, each of which comprises a plurality of tools processing wafer lots. These tools are connected to and controlled by the MES 23. The MES 23 controls operation of these tools according to preset recipes, master production schedules (MPSs), and other production information pertaining to manufacturing process setting. For example, the production information may specify the number of processing stages for the wafer lots scheduled to be processed and delivered during a preset time period. The MPS specifies wafer lots to be processed and delivered in the preset time period. Additionally, MES 23 provides production information of a production line for a preset time period, such as one month. The MES 23 monitors processing of the wafer lots, and provides processing status information thereof accordingly. The processor 27 determines a move target for wafer lots processed in the production line during the preset time period according to the production information, calculates the number of achieved moves according to production status information provided by a MES, and compares the move target and the number of achieved moves accordingly. Information pertaining to the calculated move target is stored in second database 29.

Here, the "preset time period" may be one month, and the MES 23 further provides the production information specifying the number of working days of the corresponding month and an estimated average cycle time of the wafer lots.

In order to compensate for yield loss, the move target may be further modified according to an estimated yield of the wafer lots. Thus the number of wafers ready to be delivered may fulfill the delivery requirement set by the MPS.

Accordingly, the processor 27 generates an alarm when the number of achieved moves is lower than the move target.

Figure 2:
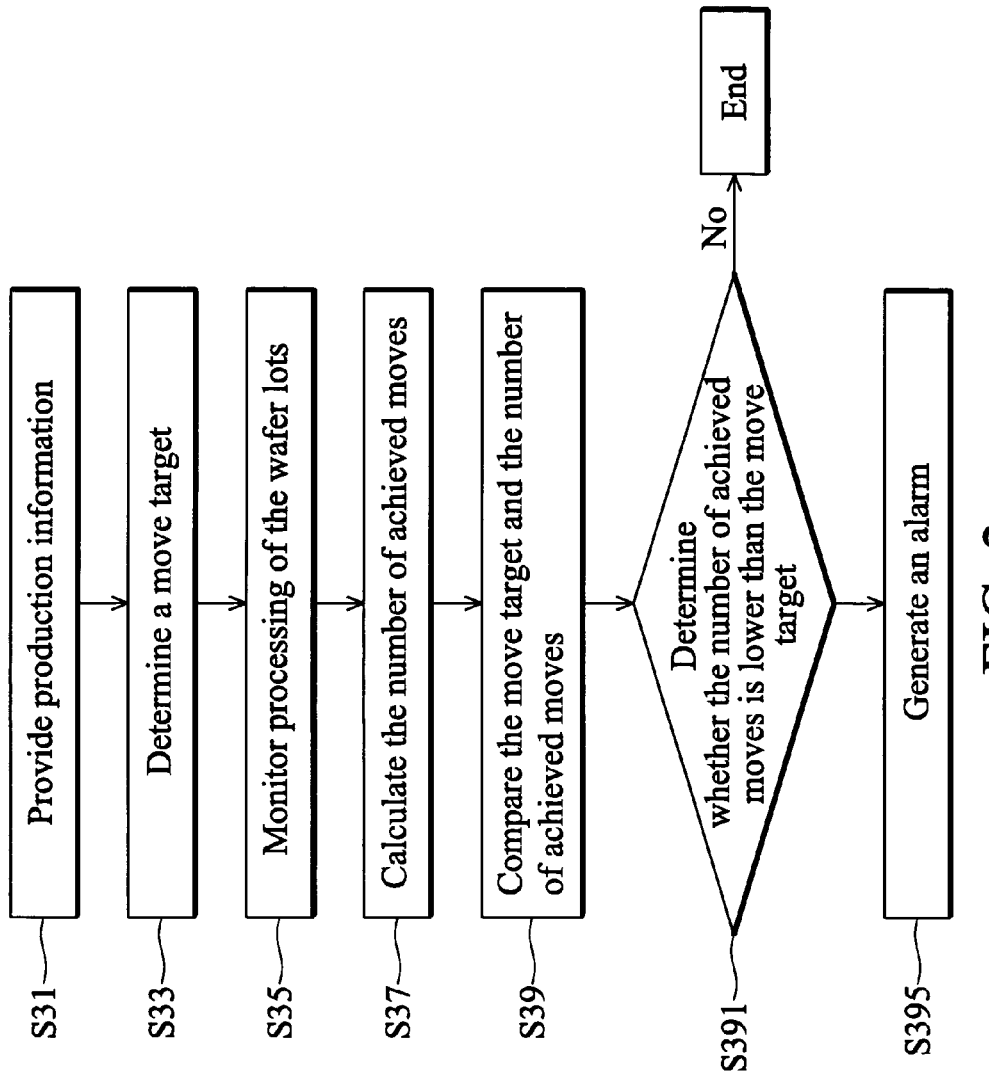
FIG. 2 is a flowchart of an embodiment of a production planning method.

FIG. 2 is a flowchart of an embodiment of a production planning method. Production information for a preset time period, for example one month, of a production line is provided in advance in step S31. The production information comprises a master production schedule (MPS) specifying wafer lots to be processed and delivered in a preset time period. The production information also specifies the number of processing stages for the wafer lots scheduled to be processed and delivered during the preset time period. Additionally, the production information specifies the number of working days of the preset time period and an estimated average cycle time of the wafer lots.

A move target is then determined, wherein the move target specifies a number of wafers being processed in the production line during the preset time period according to the production information (step S33). In order to compensate a possible yield loss, the move target may be further modified according to an estimated yield of the wafer. The move target may be determined according to the following equation:

$$E_k = \frac{MPS_t \times A\_stg \times \left(\frac{Wd_t + 1}{2CT_t}\right)}{Yd},$$

wherein the $E_k$, $MPS_t$, $A\_stg$, $Wd_t$, $CT_t$, and $Yd$ represent the move target, master production plan of time period t, number of stages required for the WIP, quantity of work time of time period t, the estimated cycle time of the WIP, and the estimated yield, respectively.

Processing of the wafer lots is monitored (step S35) and the number of achieved moves thereof is calculated accordingly (step S37). The move target and the number of achieved moves are then compared (step S39). The number of achieved moves is calculated according to production status information provided by a MES. It is then determined whether the number of achieved moves is lower than the move target (step S391), and if so, an alarm is triggered in step S395, otherwise the method proceeds to an end.

Figure 3:
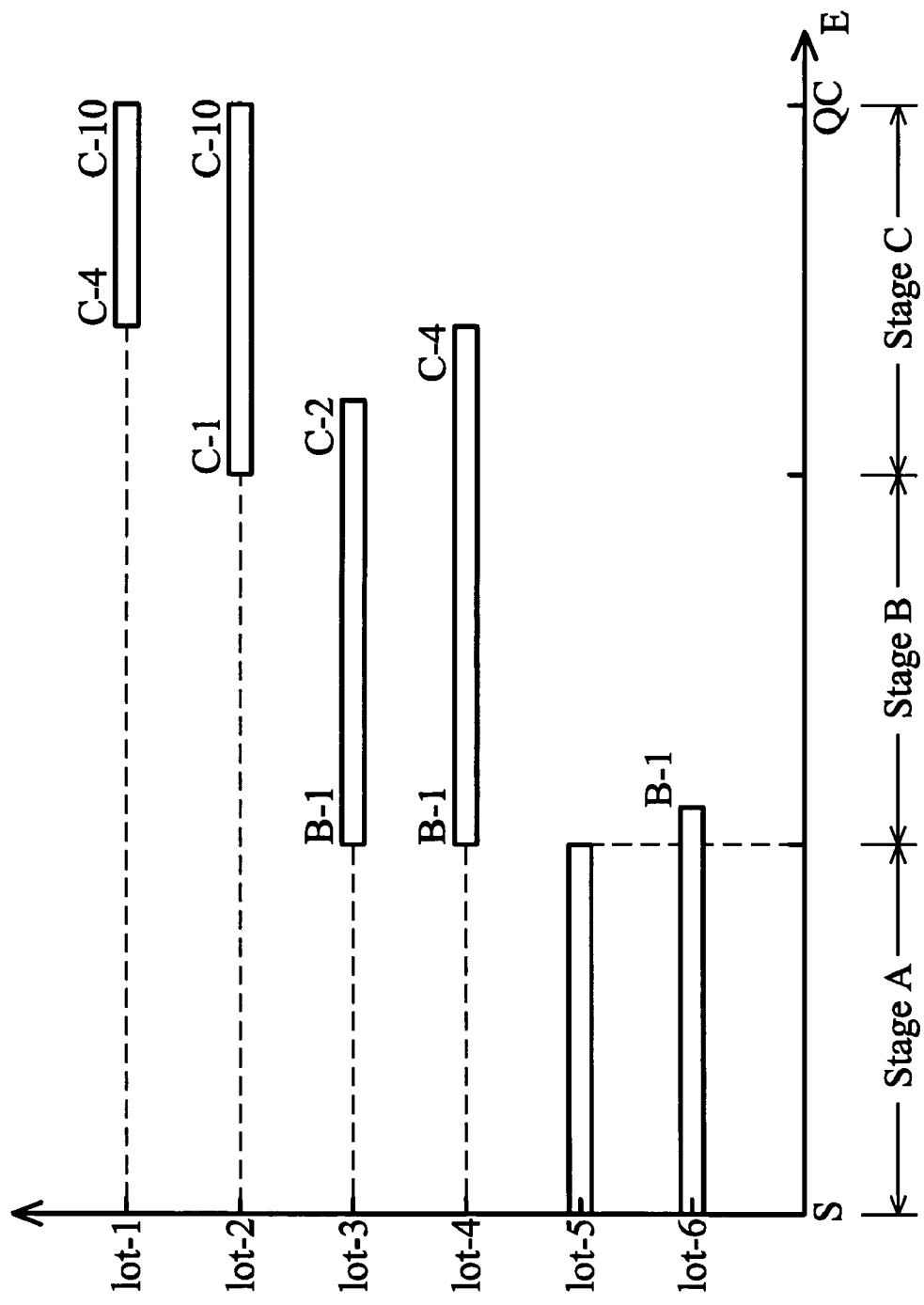
FIG. 3 is a schematic view of an embodiment of a monthly production plan for a production line.

FIG. 3 is a schematic view of an embodiment of a monthly production plan for a production line. Referring to FIG. 3, fabrication between a start point S and an end point E comprise three processes A~C, each process comprises 10 stages. Fabrication of wafer lots begins at the start point S, passes through processes A~C, quality examination process QC, and reaches the end point E. As shown in FIG. 3, lot-1 and lot-2 are to be delivered to a customer in the current month, lot-3 and lot-4 are to be delivered in the next month, and lot-5 and lot-6 are to be delivered two months later. During current month, lot-1 to lot-6 are to proceed through stages C-4~C-10, C-1~C-10, B-1~C-2, B-1~C-4, S~A-10, S~B-1, respectively.

Processing progress of a wafer lot is calculated as "WIP energy". The WIP energy of a particular wafer is the accumulated number of processed stages. A "move" achieved by a particular processing line is the sum of WIP energy calculated from all wafers processed by the processing line. The "target move" is the number of required moves during a preset time period for a particular processing line. For a wafer, the total required energy thereof is the total number of required processed stages. Here, the sum of processed stages of a particular wafer is referred to as "potential energy" thereof, and the number of required stages thereof is referred to as "kinetic energy" of the wafer.

Figure 4:
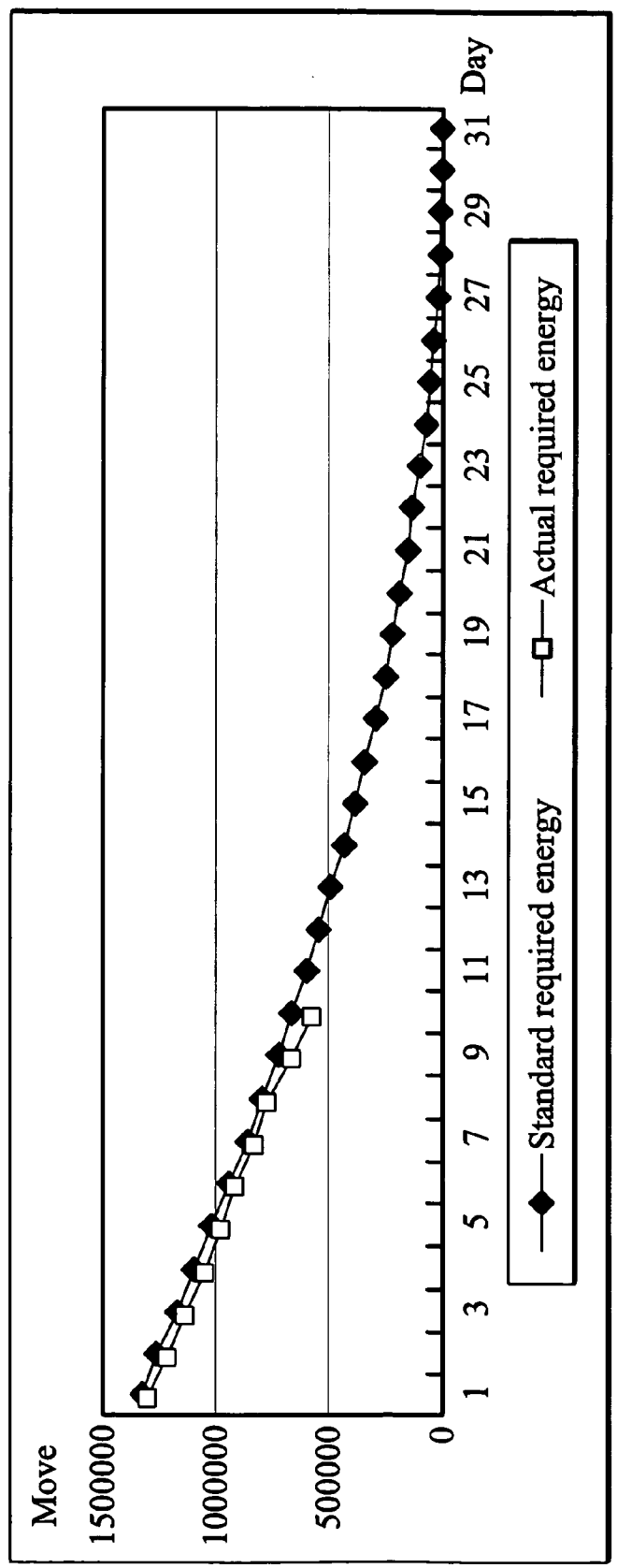
FIG. 4 shows an embodiment of move target for a production line during a month.

FIG. 4 shows an embodiment of move target for a production line during a month. Here, the move target is set for a month, for example November, which has 30 working days. The estimated average cycle time for wafer lots processed in the production line is 40 days. In the first working day of November, the number of required moves (hereinafter referred to as 'move target') for lots 1 and 2 achieved in the production line is calculated according to equation 1, wherein $E_{k1}$ is the kinetic energy (number of required moves) for the first working day, $MPS_{11}$ is planned wafer out for November, A_Stg is average required moves of lots 1 and 2, $CT_{11}$ is the average cycle time of lots 1 and 2, $Wd_{11}$ is number of working days of November, and $Y_d$ is estimated yield for lots 1 and 2.

$$E_{k1} = \frac{MPS_{11} \times A\_stg \times \left(\frac{Wd_{11} + 1}{2CT_{11}}\right)}{Yd} \quad \text{(Equation 1)}$$

As the production precedes, the number of achieved moves for wafer lots increases, meanwhile the number of required moves thereof decrease. At day 30, the number of required moves for lots 1 and 2 decreases to zero, meaning that the production of lots 1 and 2 is completed, and lots 1 and 2 are ready for delivery. In day i between the first day and the thirtieth day, the move target thereof ($E_{ki}$) is calculated according to the following equation 2, wherein i stands for the sequence of the day during the month.

$$E_{ki} = E_{k1} \times \frac{(Wd_{11} - i + 1)^2}{Wd_{11}^2} \quad \text{(Equation 2)}$$

Accordingly, a move target for each working day of November can be determined according to the described method. The profile of move target for the production line in November is detailed as the solid line in FIG. 3.

After the move target profile of the current month is determined, production is performed accordingly. As the production proceeds, the processing status is recorded and stored in a corresponding Manufacture Executive System (MES). The number of achieved moves for lots 1 and 2 is calculated each day according to the production status information stored in the MES, and number of the actual required moves thereof is calculated accordingly. The move target and actual required moves are detailed in FIG. 4. The number of actual required moves is compared to the corresponding move target every day, and an alarm is triggered when the number of required moves is higher than that specified by the move target.

Various embodiments, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. Some embodiments may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing embodiments of the invention. When implemented on a general-purpose processor, the program code combines with the processor to provide a unique apparatus that operates analogously to specific logic circuits.

Figure 5:
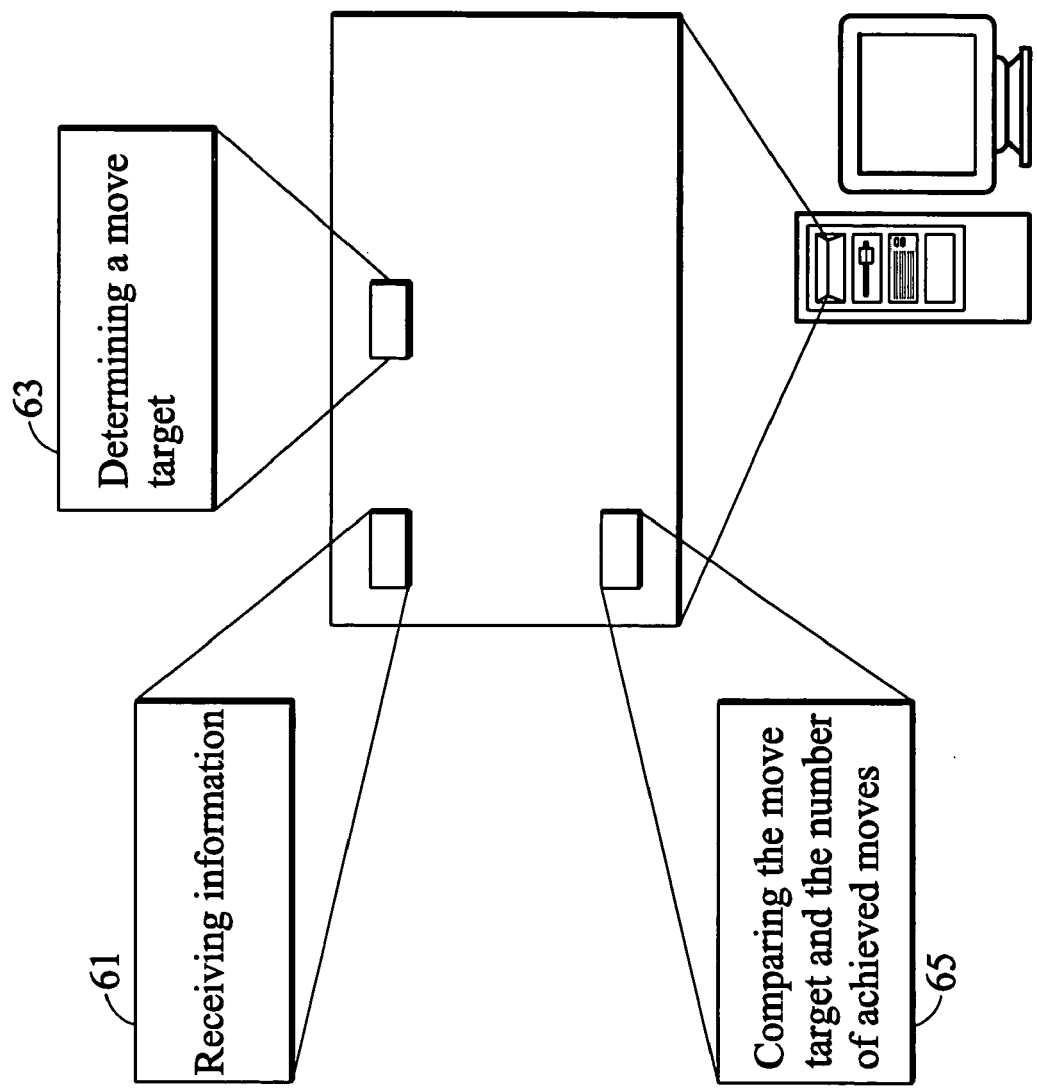
FIG. 5 shows storage medium storing a computer program providing an embodiment of a production planning method.

FIG. 5 is a diagram of a storage medium for storing a computer program embodying the method according to the present invention. The computer program product comprising a computer usable storage medium having computer readable program code embodied in the medium, the computer readable program code comprising computer readable program code 61 receiving information, a computer readable program code 63 determining a move target, and a computer readable program code 65 comparing the move target and the number of achieved moves.

The computer readable program code 61 receives production information for a preset time period of a production line, and receives the number of achieved moves of WIP processed by the production line. The computer readable program code 63 determines a move target for work-in-process (WIP) in the production line during the preset time period according to the production information. The computer readable program code 65 compares the move target and the number of achieved moves.

While the invention has been described by way of example and in terms of several embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of production planning, comprising:
   providing production information corresponding to a preset time period of a production line;
   determining a move target for work-in-process (WIP) in the production line during the preset time period according to the production information;
   monitoring processing of the WIP and calculating the number of achieved moves thereof accordingly;
   comparing the move target and the number of achieved moves; and
   generating an alarm when the number of achieved moves is lower than the move target,
   wherein the move target for WIP specifies a number of required WIP moves in the production line during the preset time period, and each of the WIP moves achieved by a particular processing line is the sum of WIP energy calculated from all wafers processed by the processing line.

2. The method of claim 1, wherein the production information comprises a master production schedule (MPS) specifying WIP to be processed and delivered in the preset time period.

3. The method of claim 1, further providing the production information specifying the number of processing stages for the WIP scheduled to be processed and delivered during the preset time period.

4. The method of claim 1, wherein the production information specifies the quantity of work time of the preset time period and an estimated cycle time of the WIP.

5. The method of claim 1, further modifying the move target according to an estimated yield of the WIP.

6. The method of claim 5, wherein the move target is determined according to the following equation:

$$E_k = \frac{MPS_t \times A\_stg \times \left(\frac{Wd_t + 1}{2CT_t}\right)}{Yd},$$

wherein the $E_k$, $MPS_t$, $A\_stg$, $Wd_t$, $CT_t$, and $Yd$ represent the move target, master production plan of time period t, number of stages required for the WIP, quantity of work time of time period t, the estimated cycle time of the WIP, and the estimated yield, respectively.

7. The method of claim 1, wherein the number of achieved moves is calculated according to production status information provided by a manufacture executive system (MES).

8. A system for production planning, comprising:
   a manufacture executive system (MES) providing production information of a production line for a preset time period, monitoring processing of the WIP, and providing processing status information of the WIP; and
   a processor determining a move target for the WIP in the production line during the preset time period according to the production information, calculating a number of achieved moves of the WIP, comparing the move target and the number of achieved moves and generating an alarm when the number of achieved moves is lower than the move target,
   wherein the move target for WIP specifies a number of required WIP moves in the production line during the preset time period, and each of the WIP moves achieved by a particular processing line is the sum of WIP energy calculated from all wafers processed by the processing line.

9. The system of claim 8, wherein the MES provides a master production schedule (MPS) specifying WIP to be processed and delivered in the preset time period.

10. The system of claim 8, wherein the MES provides the production information specifying the number of processing stages for the WIP scheduled to be processed during the preset time period.

11. The system of claim 8, wherein the MES provides the production information specifying the quantity of work time units of the preset time period and an estimated cycle time of the WIP.

12. The system of claim 8, wherein the processor further modifies the move target according to an estimated yield of the WIP.

13. The system of claim 12, wherein the processor further determines the move target according to the following equation:

$$E_k = \frac{MPS_t \times A\_stg \times \left(\frac{Wd_t + 1}{2CT_t}\right)}{Yd},$$

wherein the $E_k$, $MPS_t$, $A\_stg$, $Wd_t$, $CT_t$, and $Yd$ represent the move target, master production plan of time period t, number of stages required for the WIP, quantity of work time of time period t, the estimated cycle time of the WIP, and the estimated yield, respectively.

14. The system of claim 8, wherein the processor calculates the number of achieved moves according to production status information provided by the MES.

15. A computer readable storage medium storing a computer program providing a method of production planning, comprising:

receiving production information for a preset time period of a production line, and receiving the number of achieved moves of work-in-process (WIP) processed by the production line;

calculating a number of achieved moves of the WIP;

determining a move target for the WIP in the production line during the preset time period according to the production information;

comparing the move target and the number of achieved moves; and generating an alarm when the number of achieved moves is lower than the move target, wherein the move target for WIP specifies a number of required WIP moves in the production line during the preset time period, and each of the WIP moves achieved by a particular processing line is the sum of WIP energy calculated from all wafers processed by the processing line.

16. The storage medium of claim 15, wherein the method further modifies the move target according to an estimated yield of the WIP.

17. The storage medium of claim 15, wherein the method determines the move target according to the following equation:

$$E_k = \frac{MPS_t \times A\_stg \times \left(\frac{Wd_t + 1}{2CT_t}\right)}{Yd},$$

wherein the $E_k$, $MPS_t$, $A\_stg$, $Wd_t$, $CT_t$, and $Yd$ represent the move target, master production plan of time period t, number of stages required for the WIP, quantity of work time of time period t, the estimated cycle time of the WIP, and the estimated yield, respectively.

* * * * *